US012672447B2

(12) United States Patent
Kinjo

(10) Patent No.: US 12,672,447 B2
(45) Date of Patent: Jun. 30, 2026

(54) DISPLAY DEVICE WITH PERIPHERAL WIRING SUROUNDING SENSOR AREA

(71) Applicant: Magnolia White Corporation, Tokyo (JP)

(72) Inventor: Hiroumi Kinjo, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 377 days.

(21) Appl. No.: 18/447,332

(22) Filed: Aug. 10, 2023

(65) Prior Publication Data

US 2023/0389359 A1 Nov. 30, 2023

Related U.S. Application Data

(63) Continuation of application No. PCT/JP2021/044322, filed on Dec. 2, 2021.

(30) Foreign Application Priority Data

Feb. 12, 2021 (JP) ................................. 2021-020760

(51) Int. Cl.
*H10K 59/131* (2023.01)
*H10K 59/121* (2023.01)
(Continued)

(52) U.S. Cl.
CPC ....... *H10K 59/131* (2023.02); *H10K 59/1213* (2023.02); *H10K 59/80521* (2023.02);
(Continued)

(58) Field of Classification Search
CPC ......... H10K 59/8052; H10K 59/80521; H10K 59/131; H10K 59/1213; H10K 59/871;
(Continued)

(56) References Cited

U.S. PATENT DOCUMENTS

2006/0139254 A1 6/2006 Hayakawa et al.
2019/0034011 A1* 1/2019 Li ......................... G06F 1/1643
(Continued)

FOREIGN PATENT DOCUMENTS

JP 2000-195677 A 7/2000
JP 2008-135325 A 6/2008
(Continued)

OTHER PUBLICATIONS

International Search Report and Written Opinion mailed on Feb. 1, 2022, received for PCT Application PCT/JP2021/044322, filed on Dec. 2, 2021, 10 pages including English Translation.
(Continued)

*Primary Examiner* — John P. Dulka
(74) *Attorney, Agent, or Firm* — XSENSUS LLP

(57) ABSTRACT
According to one embodiment, a display device comprises a substrate, pixel circuits, an insulating layer, first electrodes, an organic layer, linear second electrodes, a sensor area, a relay wire, and a first connection portion and a second connection portion. At least one of the second electrodes includes a first line portion and a second line portion separated via the sensor area in plan view. The relay wire is connected to the first line portion by the first connection portion and connected to the second line portion by the second connection portion.

11 Claims, 10 Drawing Sheets

(51) Int. Cl.
_H10K 59/65_ (2023.01)
_H10K 59/80_ (2023.01)
_H10K 59/88_ (2023.01)

(52) U.S. Cl.
CPC ........... _H10K 59/871_ (2023.02); _H10K 59/65_ (2023.02); _H10K 59/80516_ (2023.02); _H10K 59/873_ (2023.02); _H10K 59/88_ (2023.02)

(58) Field of Classification Search
CPC ............. H10K 59/65; H10K 59/80516; H10K 59/873; H10K 59/88; H10K 59/122; H10K 59/121
See application file for complete search history.

(56) References Cited

U.S. PATENT DOCUMENTS

| | | | |
|---|---|---|---|
| 2019/0115415 A1* | 4/2019 | Choi | G06F 3/0412 |
| 2019/0317629 A1* | 10/2019 | Jung | G06F 1/1643 |
| 2020/0258967 A1* | 8/2020 | Kim | H10K 59/17 |
| 2020/0403057 A1 | 12/2020 | Kang et al. | |

FOREIGN PATENT DOCUMENTS

| | | |
|---|---|---|
| JP | 5386554 B2 | 1/2014 |
| JP | 2019-125551 A | 7/2019 |
| WO | 2019142438 A1 | 7/2019 |

OTHER PUBLICATIONS

Chinese Office Action issued Jul. 30, 2025, in corresponding Chinese Patent Application No. 202180093399.0, 31pp.
Japanese Office Action issued Aug. 26, 2025, in corresponding Japanese Patent Application No. JP2022-581201, 8pp.

* cited by examiner

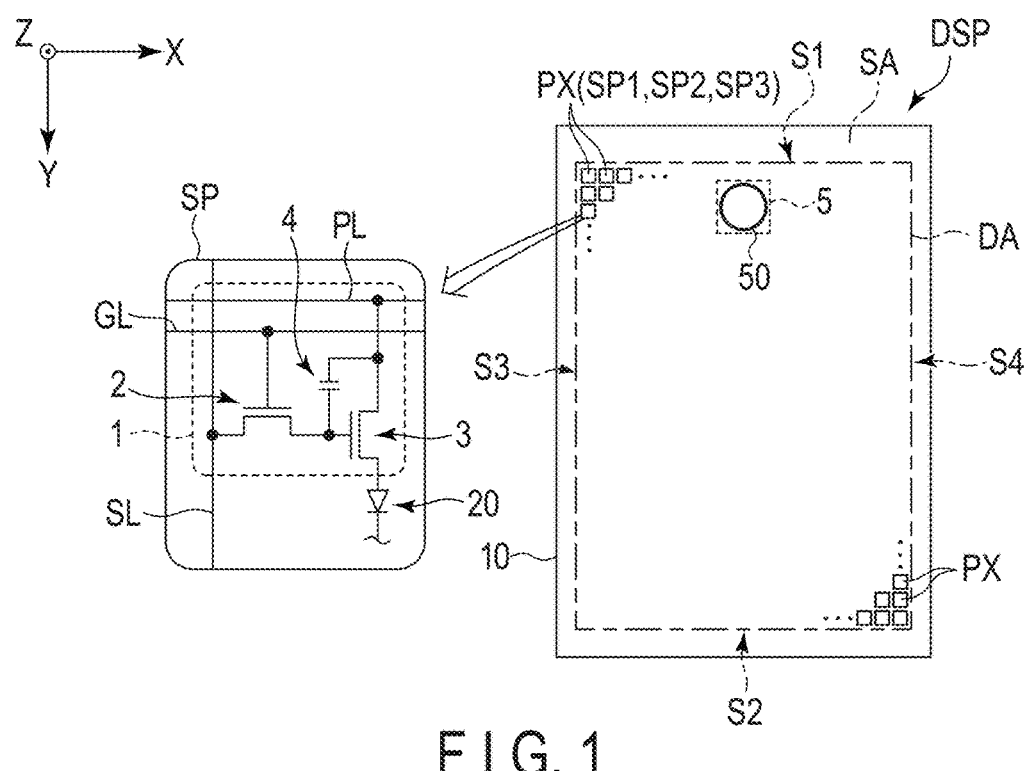
F I G. 1
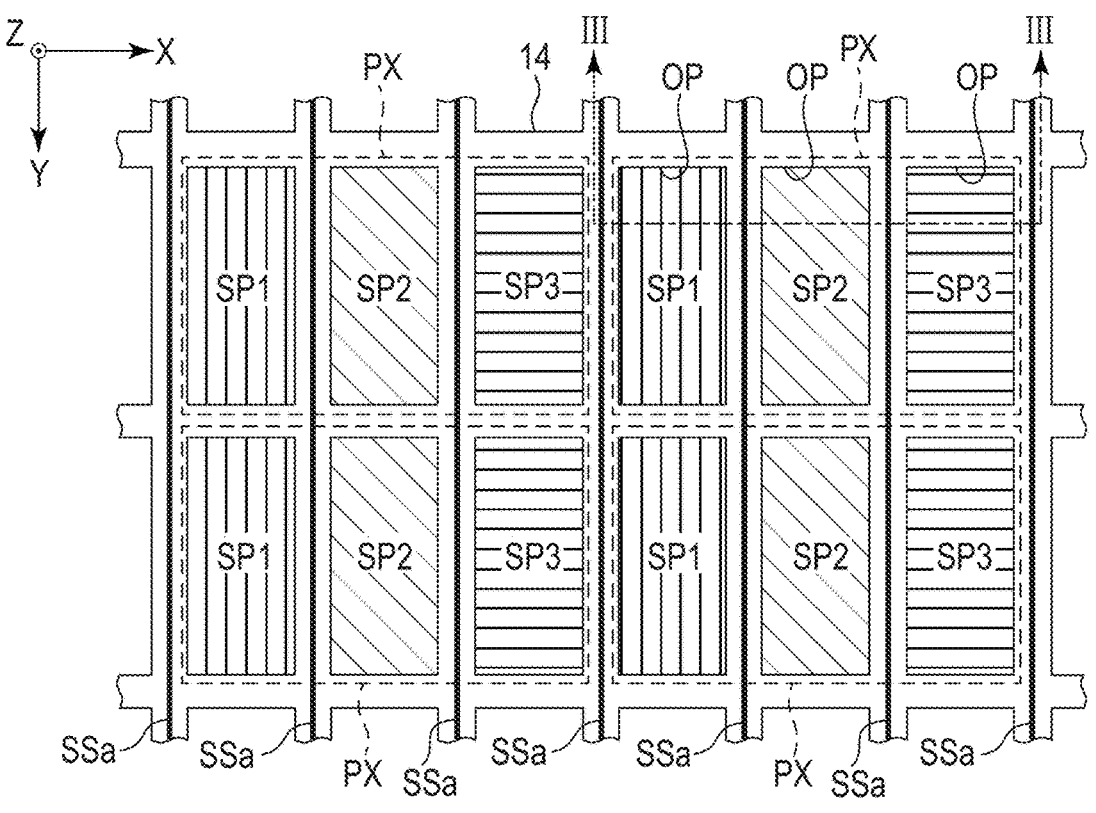
F I G. 2

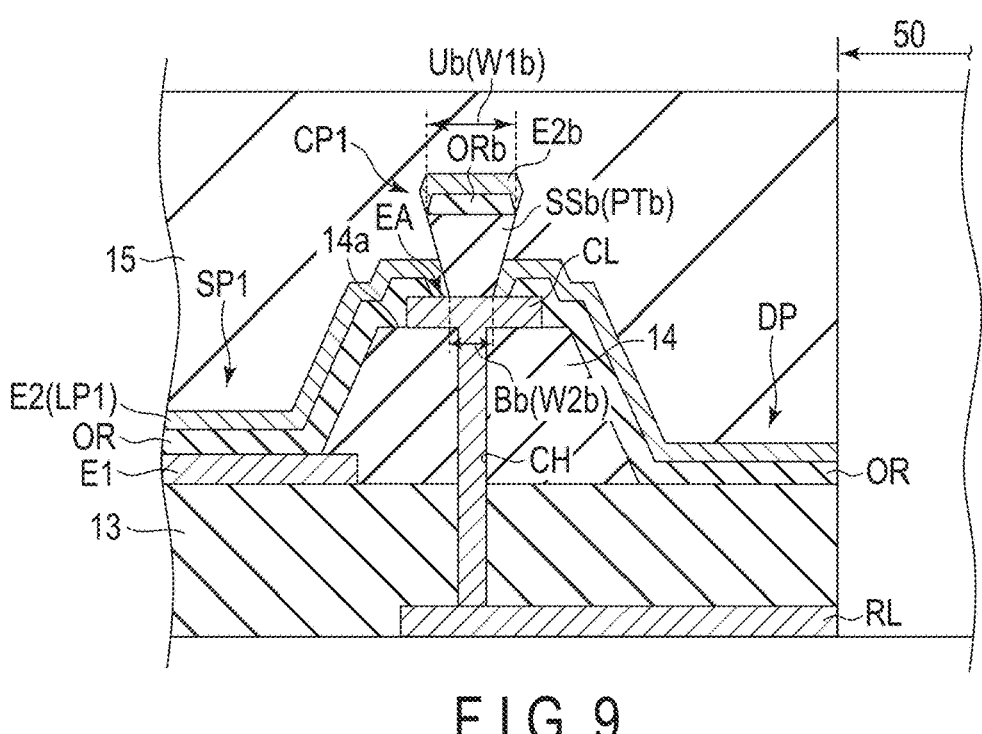
F I G. 9
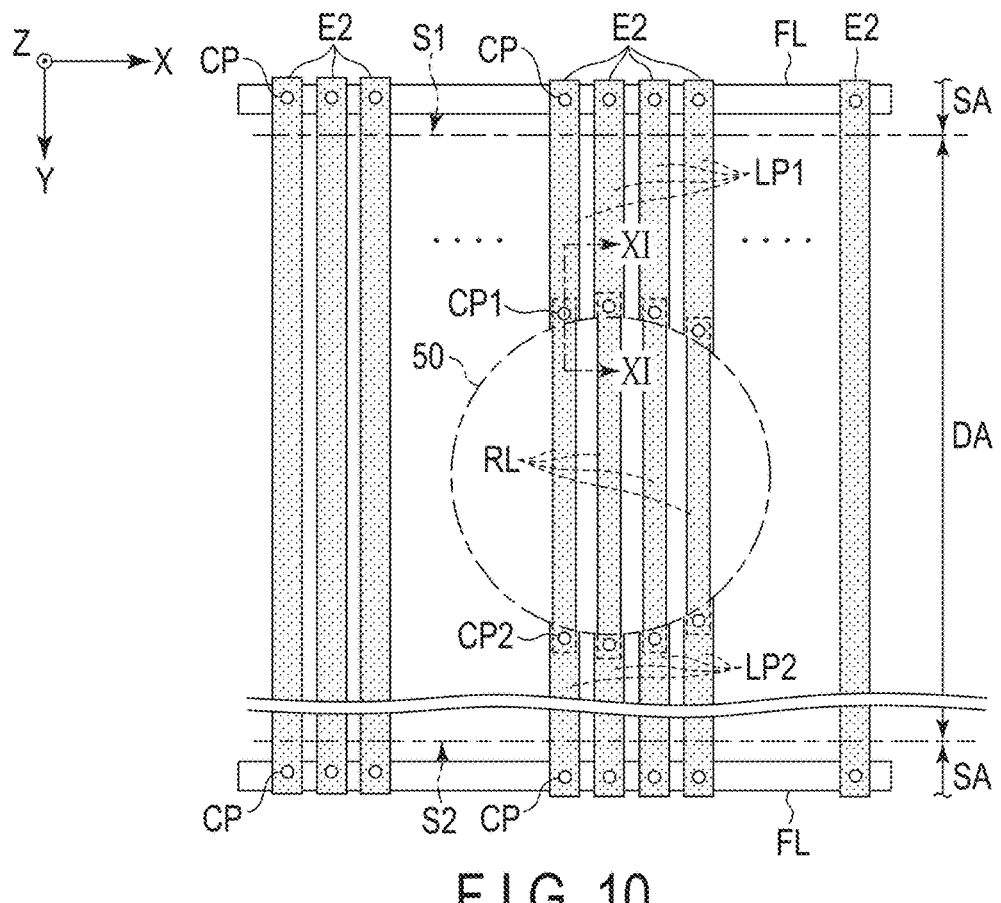
F I G. 10

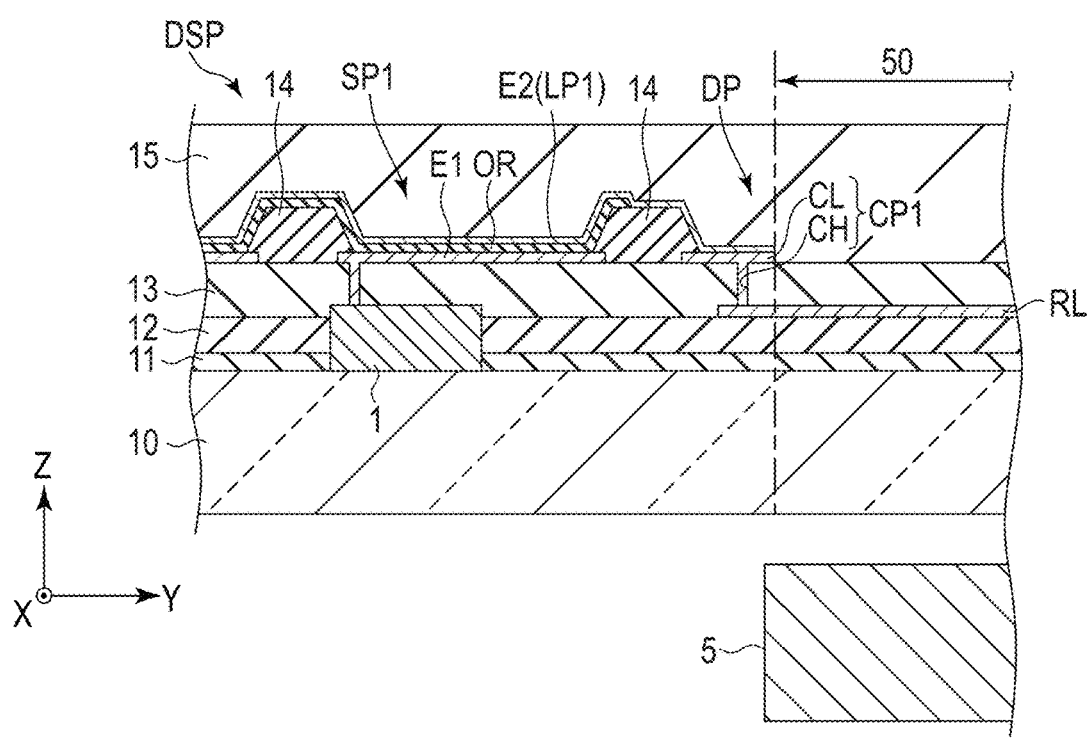
F I G. 11
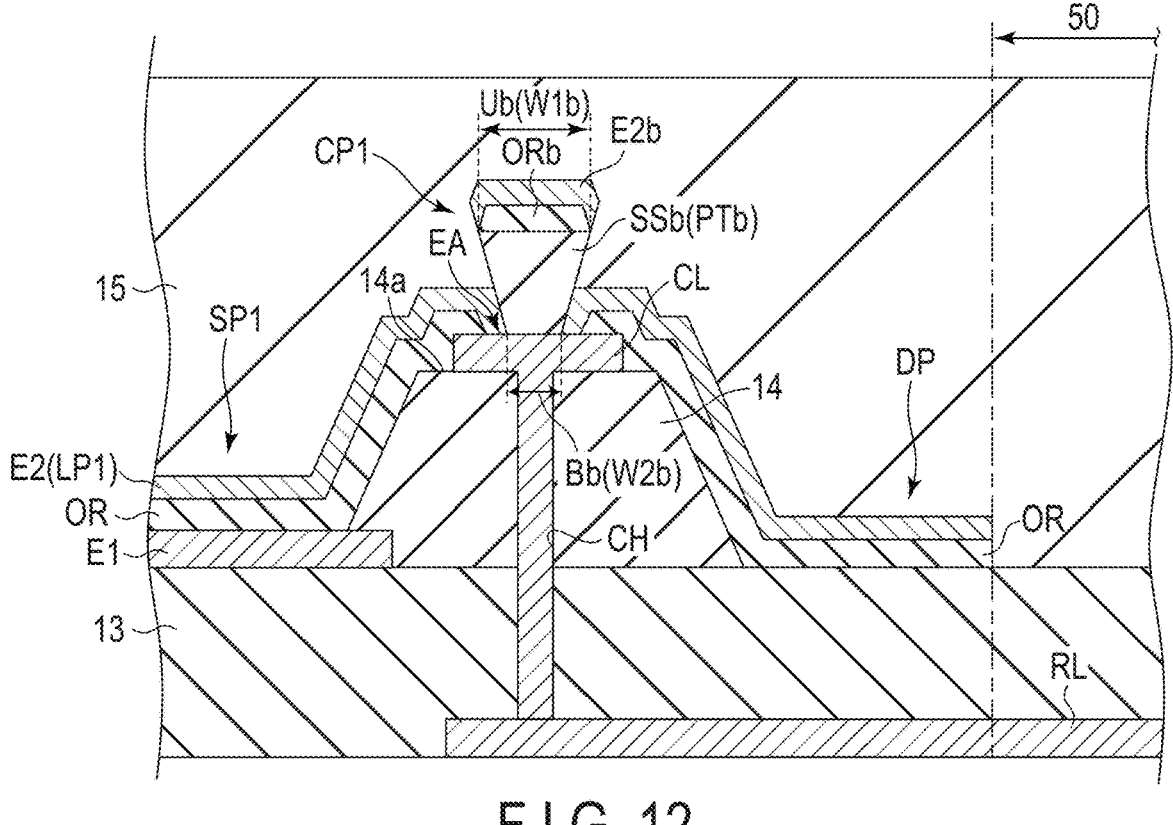
F I G. 12

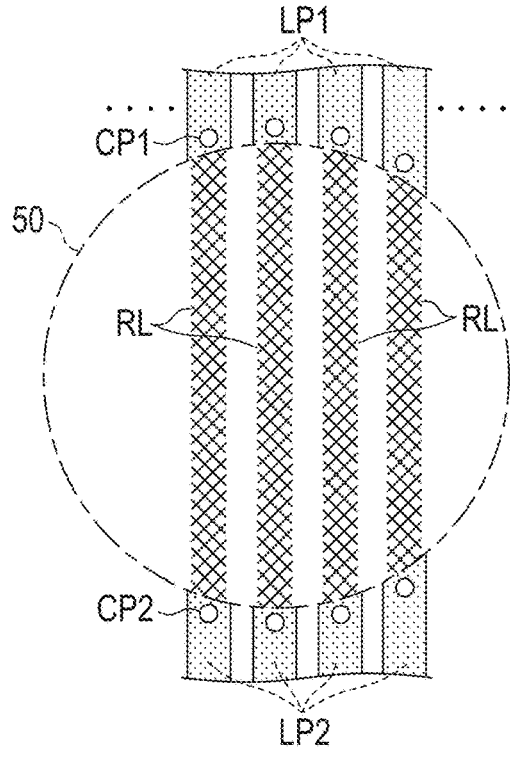
F I G. 13
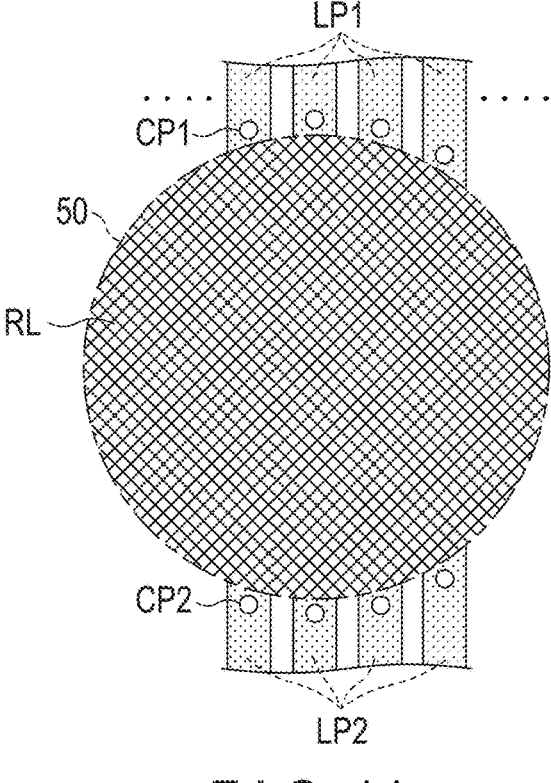
F I G. 14

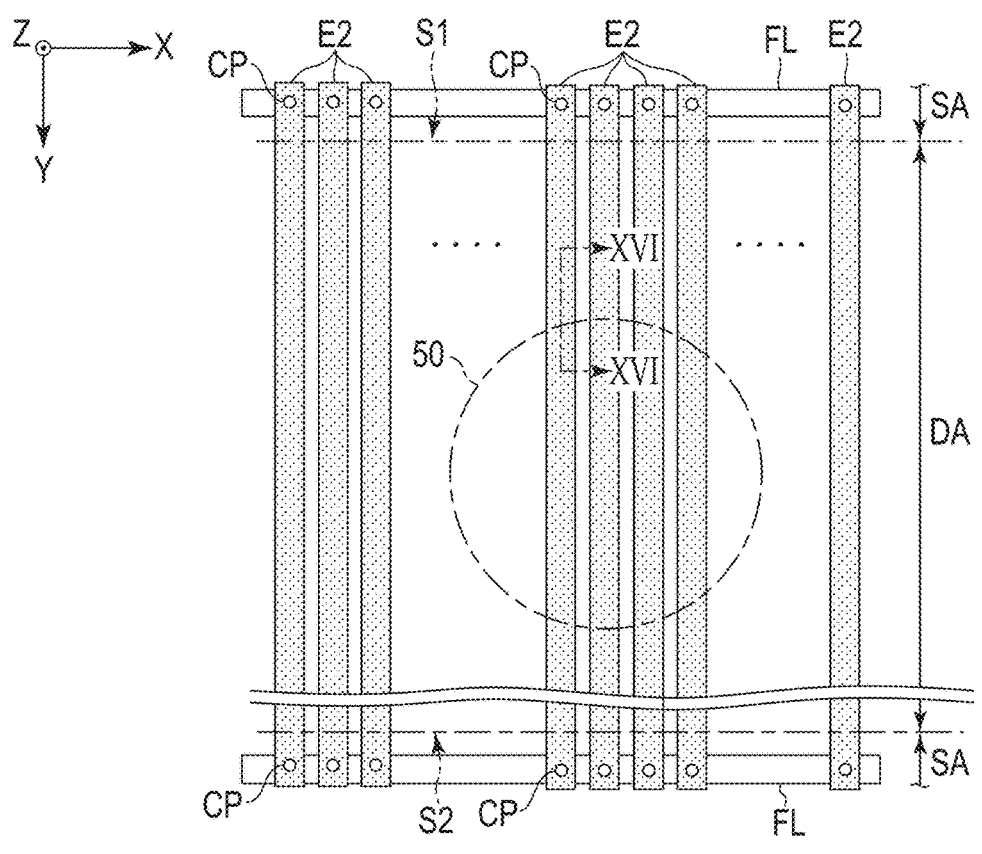
F I G. 15
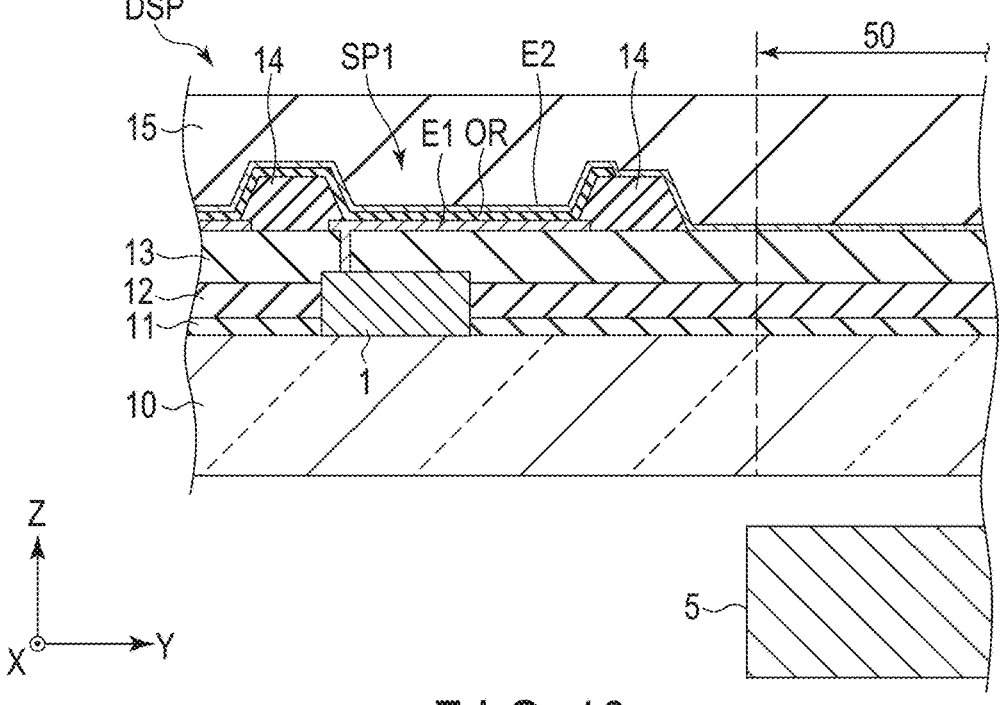
F I G. 16

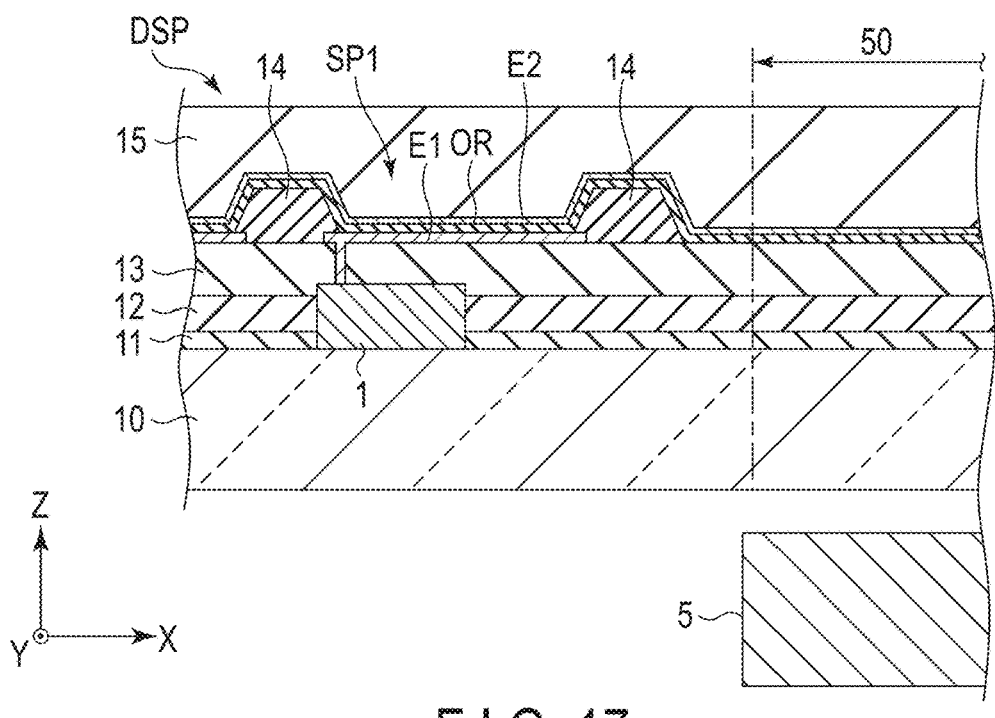
F I G. 17
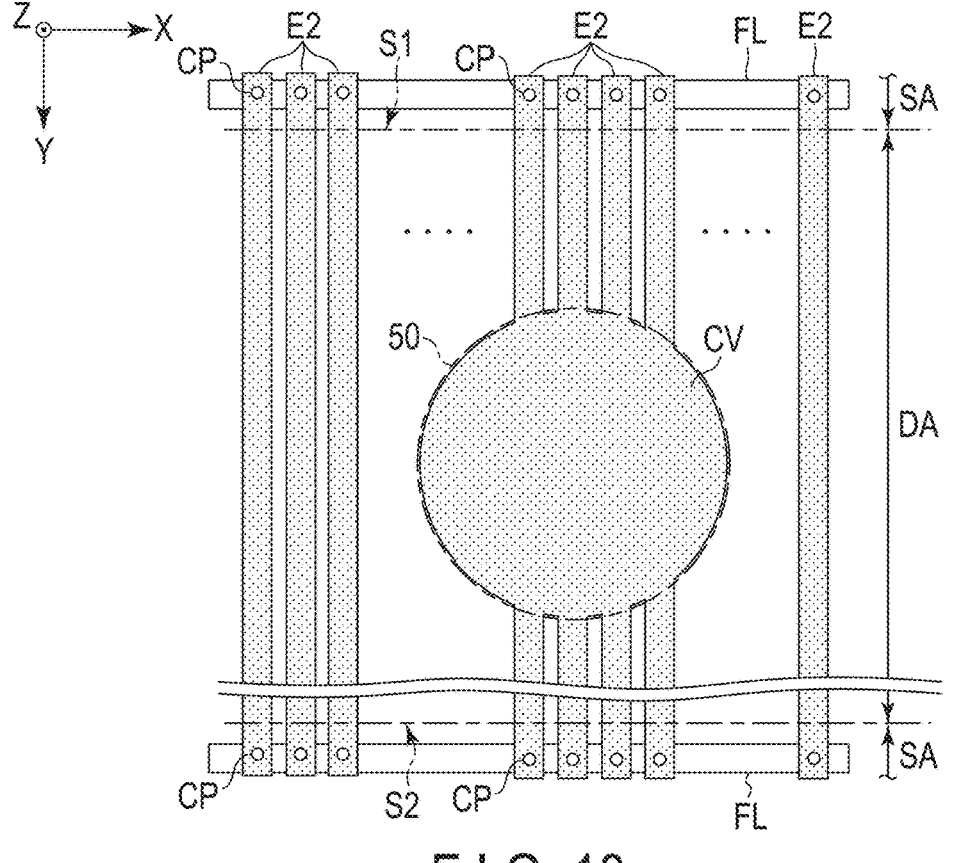
F I G. 18

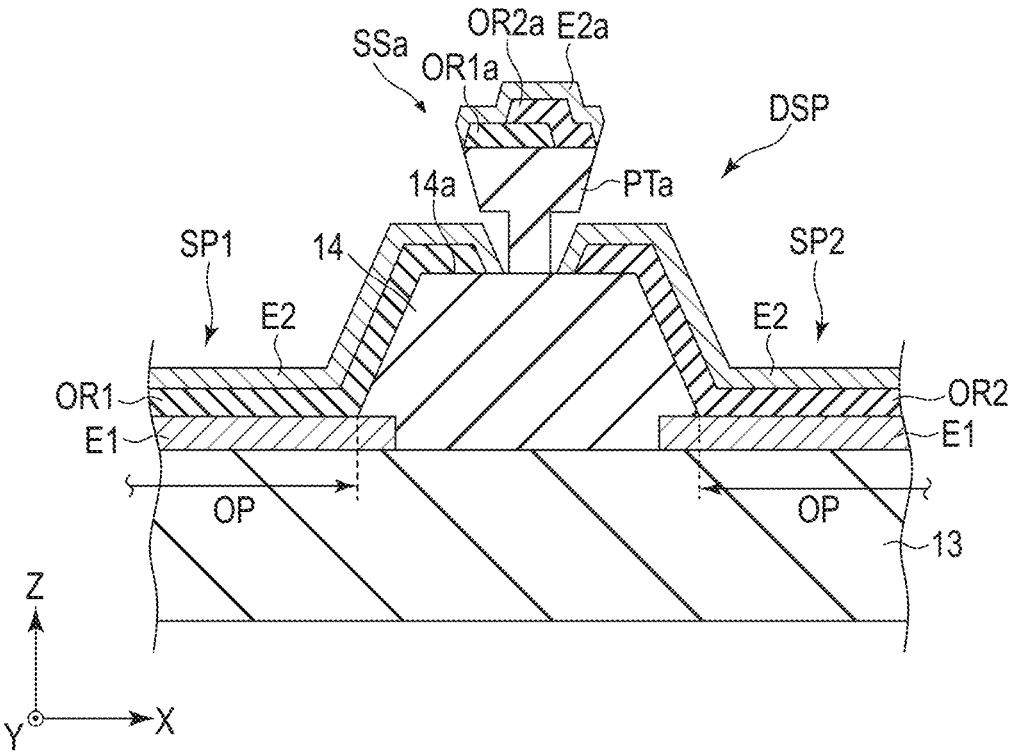
F I G. 19

DISPLAY DEVICE WITH PERIPHERAL WIRING SUROUNDING SENSOR AREA

CROSS-REFERENCE TO RELATED APPLICATIONS

This application is a Continuation Application of PCT Application No. PCT/JP2021/044322, filed Dec. 2, 2021 and based upon and claiming the benefit of priority from Japanese Patent Application No. 2021-020760, filed Feb. 12, 2021, the entire contents of all of which are incorporated herein by reference.

FIELD

Embodiments described herein relate generally to a display device.

BACKGROUND

Recently, display devices having organic light emitting diodes (OLED) applied thereto as display elements have been put into practical use. This display element comprises a first electrode, a second electrode, and an organic layer arranged between these electrodes.

Various sensors are often arranged to overlap with a display area including a plurality of pixels. In this case, it may be necessary to apply a structure different from the other portions of the display area such that sensing is not hindered in the sensor area opposed to the sensors or its vicinity.

BRIEF DESCRIPTION OF THE DRAWINGS

FIG. 1 is a view showing a configuration example of a display device according to a first embodiment.

FIG. 2 is a view showing an example of a layout of sub-pixels according to the first embodiment.

FIG. 9 is a schematic cross-sectional view showing a first connection portion according to a third embodiment.

FIG. 10 is a schematic plan view showing second electrodes, relay wires, and a sensor area according to a fourth embodiment.

FIG. 11 is a schematic cross-sectional view showing the display device along line XI-XI in FIG. 10.

FIG. 12 is a schematic cross-sectional view showing another example of a structure that can be applied to a first connection portion according to a fourth embodiment.

FIG. 13 is a schematic plan view showing an example of a configuration that can be applied to relay wires, according to the fourth embodiment.

FIG. 14 is a schematic plan view showing another example of the configuration that can be applied to the relay wire, according to the fourth embodiment.

FIG. 15 is a schematic plan view showing second electrodes and a sensor area according to a fifth embodiment.

FIG. 16 is a schematic cross-sectional view showing a display device along line XVI-XVI in FIG. 15.

FIG. 17 is a schematic cross-sectional view showing another example that can be applied to the display device according to the fifth embodiment.

FIG. 18 is a schematic plan view showing second electrodes and a sensor area according to a sixth embodiment.

FIG. 19 is a schematic cross-sectional view showing a display device according to a seventh embodiment.

DETAILED DESCRIPTION

Figure 3:
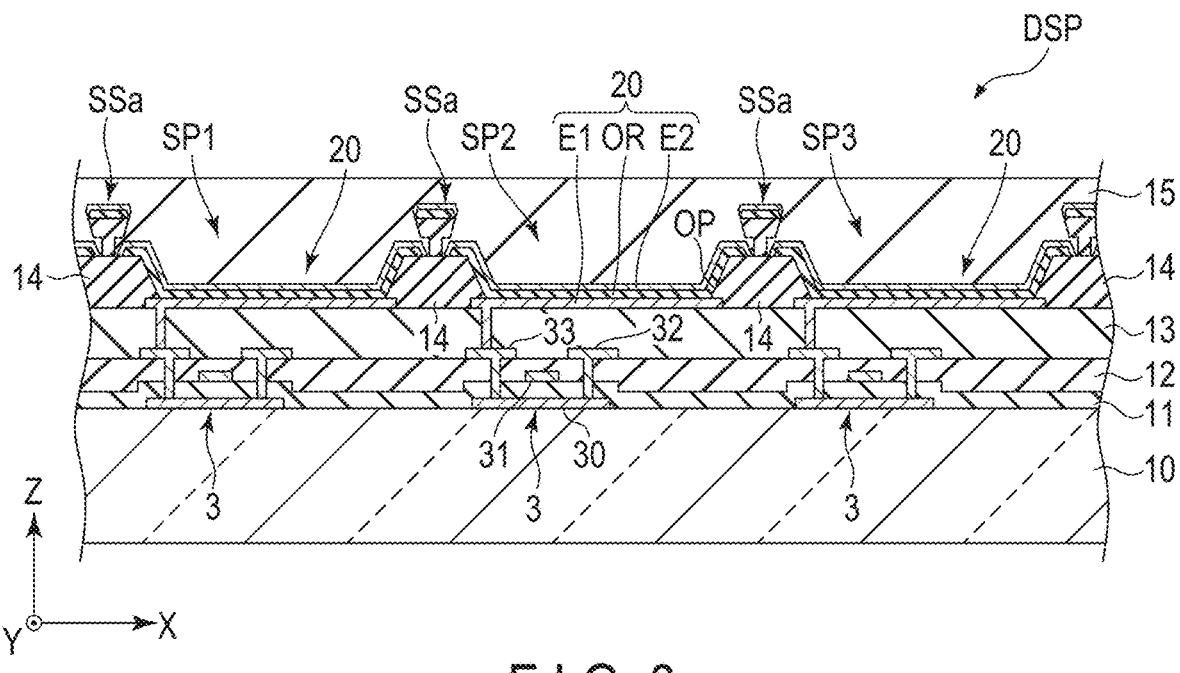
FIG. 3 is a schematic cross-sectional view showing the display device along line III-III in FIG. 2.

In general, according to one embodiment, a display device comprises: a substrate; a plurality of pixel circuits arranged above the substrate; an insulating layer covering the plurality of pixel circuits; a plurality of first electrodes arranged above the insulating layer and connected to the plurality of pixel circuits, respectively; an organic layer arranged above the plurality of first electrodes; a plurality of linear second electrodes arranged above the organic layer; a sensor area opposed to a sensor overlaid with the substrate; a relay wire arranged between the substrate and the insulating layer; and a first connection portion and a second connection portion. At least one of the plurality of second electrodes includes a first line portion and a second line portion separated via the sensor area in plan view. The relay wire is connected to the first line portion by the first connection portion and connected to the second line portion by the second connection portion.

According to another embodiment, a display device comprises: a substrate; a plurality of pixel circuits arranged above the substrate; an insulating layer covering the plurality of pixel circuits; a plurality of first electrodes arranged above the insulating layer and connected to the plurality of pixel circuits, respectively; an organic layer arranged above the plurality of first electrodes; a plurality of linear second electrodes arranged above the organic layer; and a sensor area opposed to a sensor overlaid with the substrate. The sensor area is an area which includes the substrate and the insulating layer, and does not include at least one of the first electrode and the pixel circuit. At least one of the plurality of second electrodes crosses the sensor area.

According to yet another embodiment, a display device comprises: a substrate; a plurality of pixel circuits arranged above the substrate; an insulating layer covering the plurality of pixel circuits; a plurality of first electrodes arranged above the insulating layer and connected to the plurality of pixel circuits, respectively; an organic layer arranged above the plurality of first electrodes; a plurality of linear second electrodes arranged above the organic layer; a sensor area opposed to a sensor overlaid with the substrate; and a conductive coating layer covering the sensor area. The sensor area is an area which includes the substrate and the insulating layer, and does not include at least one of the first electrode and the pixel circuit. The coating layer is connected to at least one of the plurality of second electrodes.

According to these configurations, a display device in which a sensor area opposed to a sensor and a structure in its vicinity are improved, can be provided.

Several embodiments will be described hereinafter with reference to the accompanying drawings.

The disclosure is merely an example, and proper changes within the spirit of the invention, which are easily conceivable by a person of ordinary skill in the art, are included in the scope of the invention as a matter of course. In addition, in some cases, in order to make the description clearer, the widths, thicknesses, shapes and the like, of the respective parts are schematically illustrated in the drawings, compared to the actual modes. However, the schematic illustration is merely an example, and adds no restriction to the interpretation of the invention. In addition, in the specification and drawings, structural elements which function in the same or a similar manner to those described in connection with preceding drawings are denoted by like reference numbers, detailed description thereof being omitted unless necessary.

In the figures, an X-axis, a Y-axis and a Z-axis orthogonal to each other are described to facilitate understanding as needed. A direction along the X-axis is referred to as a first direction, a direction along the Y-axis is referred to as a second direction, and a direction along the Z-axis is referred to as a third direction. A plane defined by the X-axis and the Y-axis is referred to as an X-Y plane, and a plane defined by the X-axis and Z-axis is referred to as an X-Z plane. Viewing the X-Y plane is referred to as plan view.

A display device DSP of the embodiments is an organic electroluminescent display device comprising an organic light emitting diode (OLED) as a display element, and can be mounted on televisions, personal computers, vehicle-mounted devices, tablet terminals, smartphones, mobile phones, and the like.

First Embodiment

FIG. 1 is a view showing a configuration example of a display device DSP according to a first embodiment. The display device DSP has a display area DA where images are displayed and a peripheral area SA outside the display area DA, on an insulating substrate 10. The substrate 10 may be glass or a flexible resin film.

The display area DA includes a plurality of pixels PX arrayed in a matrix in the first direction X and the second direction Y. The pixel PX comprises a plurality of sub-pixels SP. As an example, the pixel PX comprises a red sub-pixel SP1, a green sub-pixel SP2, and a blue sub-pixel SP3. In addition to the sub-pixels of the above three colors, the pixel PX may comprise four or more sub-pixels including a sub-pixel of the other color such as white.

The sub-pixel SP comprises a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are, for example, switching elements constituted by thin-film transistors.

At the pixel switch 2, a gate electrode is connected to a scanning line GL. Either of a source electrode and a drain electrode of the pixel switch 2 is connected to a signal line SL, and the other is connected to a gate electrode of the drive transistor 3 and the capacitor 4. At the drive transistor 3, either of the source electrode and the drain electrode is connected to a power line PL and the capacitor 4, and the other is connected to an anode of a display element 20. A common voltage is supplied to a cathode of the display element 20. The configuration of the pixel circuit 1 is not limited to the example shown in the figure.

The display element 20 is an organic light emitting diode (OLED) serving as a light emitting element. For example, the sub-pixel SP1 comprises a display element which emits light corresponding to a red wavelength, the sub-pixel SP2 comprises a display element which emits light corresponding to a green wavelength, and the sub-pixel SP3 comprises a display element which emits light corresponding to a blue wavelength. The configuration of the display element 20 will be described later.

The display device DSP further comprises a sensor 5. The sensor 5 is arranged on a back side of the substrate 10. As shown in the figure, the sensor 5 overlaps with the display area DA in plan view. The area overlapping with the sensor 5, in the display area DA, is hereinafter referred to as a sensor area 50.

For example, the sensor 5 includes at least one of a camera, a sensor for detecting ambient light, a sensor for detecting proximity of an object, and a sensor for detecting fingerprints. The sensor 5 may be the other type of sensor. A plurality of sensors 5 may be arranged at positions overlapping with the display area DA, and a plurality of sensor areas 50 corresponding to these sensors 5 may be arranged in the display area DA.

The display area DA has a rectangular shape with a first side S1, a second side S2, a third side S3, and a fourth side S4. The first side S1 and the second side S2 are parallel to the first direction X. The third side S3 and the fourth side S4 are parallel to the second direction Y. In the example of FIG. 1, a distance between the sensor area 50 and the first side S1 is smaller than a distance between the sensor area 50 and the second side S2. In addition, a distance between the sensor area 50 and the third side S3 is the same as a distance between the sensor area 50 and the fourth side S4. Positions of the sensor 5 and the sensor area 50 shown in FIG. 1 are only examples, and the sensor 5 and the sensor area 50 can be arranged in the display area DA in various other manners.

FIG. 2 is a view showing an example of a layout of the sub-pixels SP1, SP2, and SP3. Four pixels PX will be focused here. In each of the pixels PX, the sub-pixels SP1, SP2, and SP3 are arranged in this order in the first direction X. In other words, a column constituted by a plurality of sub-pixels SP1 arranged in the second direction Y, a column constituted by a plurality of sub-pixels SP2 arranged in the second direction Y, and a column constituted by a plurality of sub-pixels SP3 arranged in the second direction Y are alternately arranged in the first direction X, in the display area DA.

A rib 14 is arranged at boundaries of the sub-pixels SP1, SP2, and SP3. In the example of FIG. 2, the rib 14 has a grating shape having parts located between the sub-pixels SP adjacent to each other in the first direction X and parts located between the sub-pixels SP adjacent to each other in the second direction Y. The rib 14 forms apertures OP at the sub-pixels SP1, SP2, and SP3, respectively.

Dividing structures SSa extending in the second direction Y are arranged between the sub-pixels SP1 and SP2, between the sub-pixels SP2 and SP3, and between the sub-pixels SP1 and SP3. In other words, each dividing structure SSa is located at the boundary between the sub-pixels SP of different colors. For example, the dividing structure SSa has a linear shape extending between both ends of the display area DA in the second direction Y.

FIG. 3 is a schematic cross-sectional view showing the display device DSP along line III-III in FIG. 2. In FIG. 3, the drive transistors 3 and the display elements 20 are shown as the elements arranged in the sub-pixels SP1, SP2, and SP3 and illustration of the other elements is omitted.

The display device DSP comprises the above-described substrate 10, insulating layers 11, 12, and 13, the above-described rib 14, a sealing layer 15, and the above-described dividing structures SSa. The insulating layers 11, 12, and 13 are stacked on the substrate 10 in the third direction Z. For example, the insulating layers 11 and 12 are formed of an inorganic material, and the insulating layer 13, the rib 14, and the sealing layer 15 are formed of an organic material.

The drive transistor 3 comprises a semiconductor layer 30 and electrodes 31, 32, and 33. The electrode 31 corresponds to a gate electrode. Either of the electrodes 32 and 33 corresponds to a source electrode, and the other corresponds to a drain electrode. The semiconductor layer 30 is arranged between the substrate 10 and the insulating layer 11. The electrode 31 is arranged between the insulating layers 11 and 12. The electrodes 32 and 33 are arranged between the insulating layers 12 and 13, and are in contact with the semiconductor layer 30 through a contact hole which penetrates the insulating layers 11 and 12.

Thus, the drive transistor 3 is arranged on the substrate 10 and covered with the insulating layer 13. The other elements of the pixel circuit 1 shown in FIG. 1 are also arranged on the substrate 10 and covered with the insulating layer 13. The other insulating layer may be interposed between the pixel circuit 1 and the substrate 10.

The display element 20 comprises a first electrode E1, an organic layer OR, and a second electrode E2. The first electrode E1 is an electrode arranged in each sub-pixel SP, and may be referred to as a pixel electrode, a lower electrode or an anode. The second electrode E2 is an electrode arranged commonly for the plurality of sub-pixels SP or the plurality of display elements 20, and is referred to as a common electrode, an upper electrode or a cathode in some cases.

The rib 14 is arranged on the insulating layer 13. The first electrode E1 is arranged on the insulating layer 13 and overlaps with the aperture OP. A peripheral portion of the first electrode E1 is covered with the rib 14. The first electrode E1 is electrically connected to the electrode 33 through a contact hole which penetrates the insulating layer 13. The first electrode E1 is formed of a metal material. However, the first electrode E1 may be formed of a transparent conductive material such as an indium tin oxide (ITO) or an indium zinc oxide (IZO) or may be a stacked layer body of a transparent conductive material and a metal material.

The organic layer OR covers the first electrode E1 and the rib 14. The organic layer OR is in contact with the first electrode E1 through the aperture OP. A part of the organic layer OR is located on the rib 14.

The second electrode E2 covers the organic layer OR. The second electrode E2 is formed of a metal material. However, the second electrode E2 may be formed of a transparent conductive material such as ITO or IZO.

Although the details will be described later, the dividing structures SSa are arranged on the rib 14 in the present embodiment. The sealing layer 15 covers the dividing structures SSa and the second electrode E2. The sealing layer 15 is formed to be thicker than, for example, the insulating layers 11, 12, and 13 and the rib 14, protects the organic layer OR from moisture and the like, and planarizes unevenness caused by the rib 14.

Figure 4:
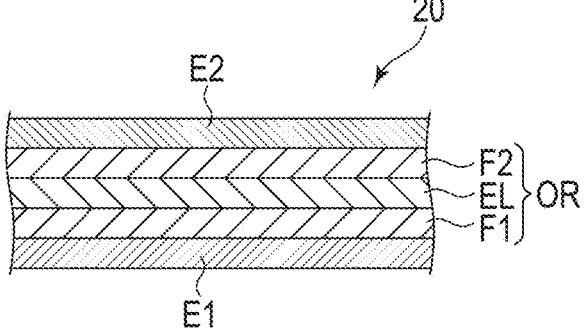
FIG. 4 is a cross-sectional view showing an example of a layer configuration applicable to an organic layer.

FIG. 4 is a cross-sectional view showing an example of the layer configuration applicable to the organic layer OR. For example, the organic layer OR includes a first functional layer F1, a light emitting layer EL, and a second functional layer F2 which are sequentially stacked from the first electrode E1 to the second electrode E2.

When the electric potential of the first electrode E1 is relatively higher than that of the second electrode E2, the first electrode E1 corresponds to an anode, and the second electrode E2 corresponds to a cathode. In addition, when the electric potential of the second electrode E2 is relatively higher than that of the first electrode E1, the second electrode E2 corresponds to an anode, and the first electrode E1 corresponds to a cathode.

As an example, when the first electrode E1 corresponds to an anode, the first functional layer F1 includes at least one of a hole injection layer, a hole transport layer, and an electron blocking layer, and the second functional layer F2 includes at least one of an electron transport layer, an electron injection layer, and a hole blocking layer.

When a potential difference is formed between the first electrode E1 and the second electrode E2, the light emitting layer EL emits light. In the present embodiment, it is assumed that the light emitting layers EL included in the organic layers OR of the sub-pixels SP1, SP2, and SP3 emit light of the same color (for example, white color). In this case, for example, a color filter corresponding to the color of the sub-pixels SP1, SP2, and SP3 may be arranged above the resin layer 15. In addition, a layer including the quantum dots which are excited by the light emitted from the light emitting layer EL to generate light of the color corresponding to the sub-pixels SP1, SP2, and SP3 may be arranged in the sub-pixels SP1, SP2, and SP3.

Figure 5:
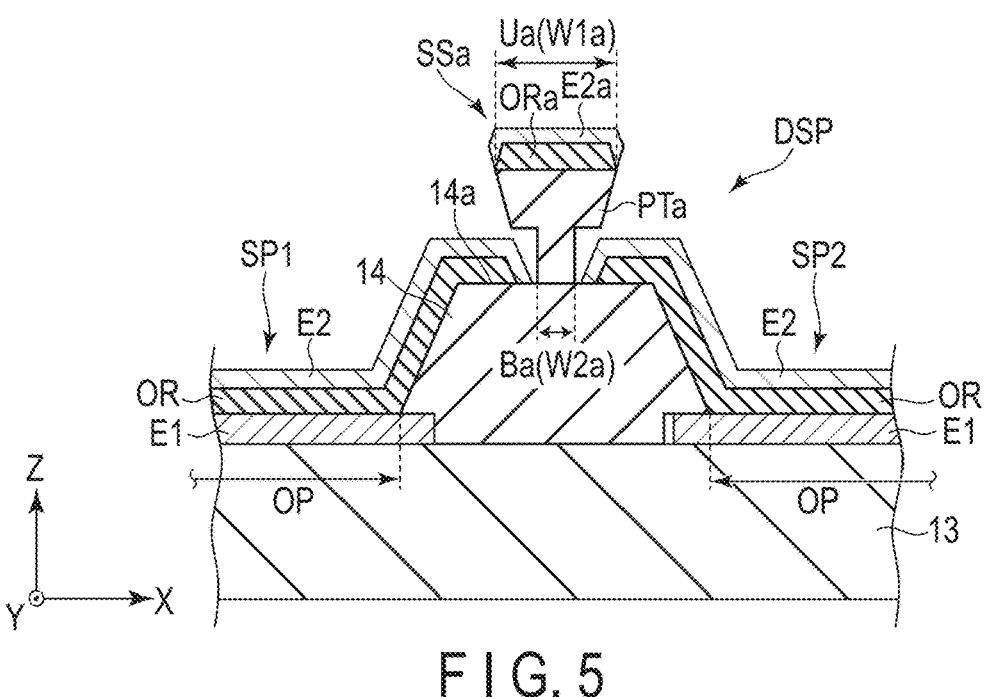
FIG. 5 is a schematic cross-sectional view showing a dividing structure and its vicinity according to the first embodiment.

FIG. 5 is a schematic cross-sectional view showing the dividing structure SSa and its vicinity. The structure of the boundary between the sub-pixels SP1 and SP2 is shown in this figure, but the same structure can also be applied to the boundary between the sub-pixels SP2 and SP3 and the boundary between the sub-pixels SP1 and SP3.

The dividing structure SSa comprises a partition PTa arranged on an upper surface 14a of the ribs 14. The partition PTa includes an upper portion Ua and a lower portion Ba located under the upper portion Ua. The lower portion Ba is in contact with the upper surface 14a. A first width W1a of the upper portion Ua is greater than a second width W2a of the lower portion Ba (W1a>W2a). The width of the partition PTa gradually decreases between the upper portion Ua and the lower portion Ba. This shape of the partition PTa may be referred to as an overhanging shape.

The organic layer OR and the second electrode E2 are divided by the dividing structure SSa. In other words, the organic layer OR overlapping with the aperture OP of the sub-pixel SP1 is separated from the organic layer OR overlapping with the aperture OP of the sub-pixel SP2, and the partition PTa is interposed between these organic layers OR. In addition, the second electrode E2 overlapping with the aperture OP of the sub-pixel SP1 is separated from the second electrode E2 overlapping with the aperture OP of the sub-pixel SP2, and the partition PTa is interposed between these second electrodes E2. By thus separating the organic layers OR of the sub-pixels SP of different colors, crosstalk between these sub-pixels SP can be suppressed.

An organic layer ORa and a conductive layer E2a covering the organic layer ORa are arranged on the partition PTa. The organic layer ORa is formed of the same material as the organic layers OR. The conductive layer E2a is formed of the same material as the second electrodes E2. The organic layer ORa is separated from the organic layers OR arranged in the sub-pixels SP1 and SP2. The conductive layer E2a is separated from the second electrodes E2 arranged in the sub-pixels SP1 and SP2.

The organic layers OR and the second electrodes E2 are formed on an entire surface of the display area DA by, for example, vacuum deposition. At this time, by attaching materials from a deposition source to the upper surface of the partition PTa, the organic layer ORa and the conductive layer E2a are formed. In contrast, the materials from the deposition source are hardly attached to side surfaces of the partition PTa. As a result, the organic layer OR and the organic layer ORa are divided from each other, and the second electrode E2 and the conductive layer E2a are divided from each other.

Figure 6:
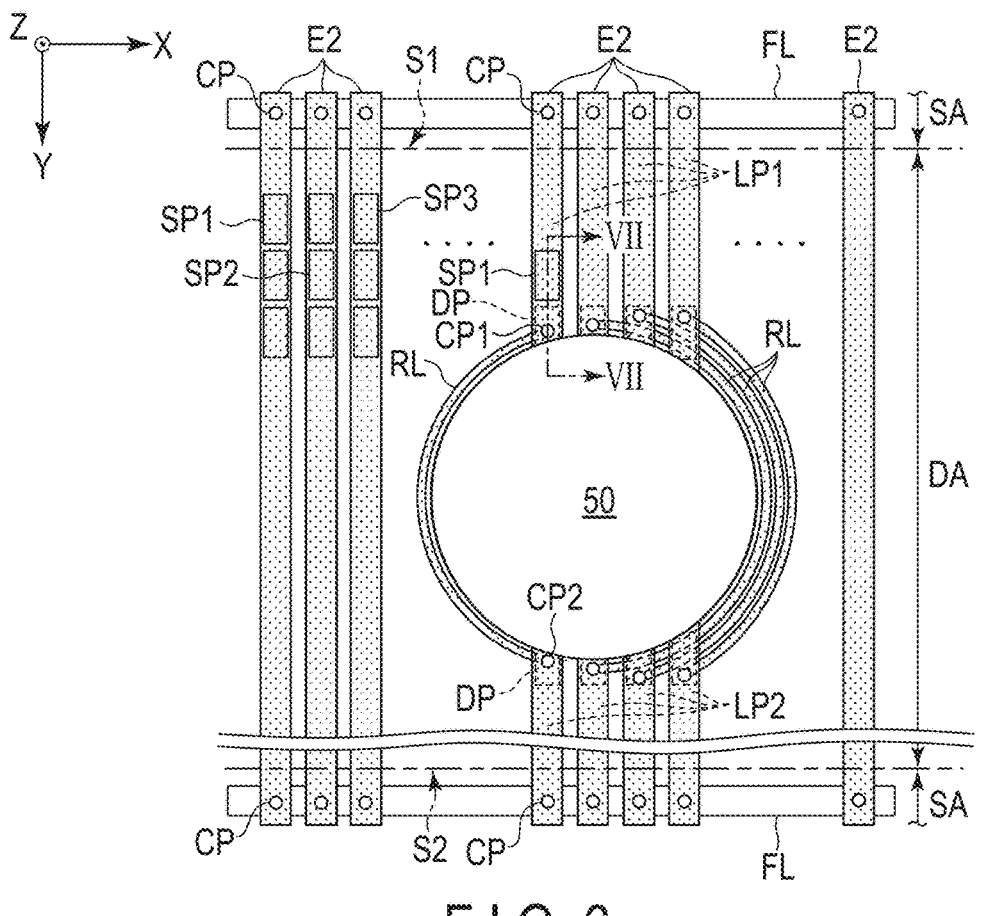
FIG. 6 is a schematic plan view showing second electrodes, relay wires and a sensor area according to the first embodiment.

FIG. 6 is a schematic plan view showing the second electrodes E2 and the sensor area 50. In the present embodiment, the sensor area 50 is a hole of a regular circle (sensor hole) which penetrates the substrate 10 and each layer arranged on the substrate 10 (substrate 10, insulating layers 11, 12, and 13, sealing layer 15 and the like) shown in FIG. 3. As an example, the sensor area 50 has a diameter of several millimeters. The shape of the sensor area 50 is not limited to a regular circle, but may be other shapes such as an ellipse or a rectangle.

The second electrode E2 has a linear (strip) shape extending in the second direction Y. For example, the second electrode E2 shown at the left end of FIG. 6 overlaps with a plurality of sub-pixels SP1 arranged in the second direction Y, the second electrode E2 that is the second from the left end overlaps with a plurality of sub-pixels SP2 arranged in the second direction Y, and the second electrode E2 that is the third from the left end overlaps with a plurality of sub-pixels SP3 arranged in the second direction Y. Thus, the second electrode E2 overlapping with the sub-pixel SP1, the second electrode E2 overlapping with the sub-pixel SP2, and the second electrode E2 overlapping with the sub-pixel SP3 are arranged in the first direction X in the display area DA.

Although not shown in FIG. 6, the above-described dividing structure SSa (partition PTa) is arranged between the adjacent second electrodes E2. In addition, an organic layer OR having substantially the same shape as the second electrode E2 is arranged under the second electrode E2 shown in FIG. 6.

One end portion of the second electrode E2 is located in the peripheral area SA on the side of the first side S1 of the display area DA. The other end portion of the second electrode E2 is located in the peripheral area SA on the side of the second side S2 of the display area DA. All these end portions are connected to power supply lines FL, which is a common voltage supply source, through connection portions CP provided in the peripheral area SA.

Some of the plurality of second electrodes E2 include first line portions LP1 and second line portions LP2 that are separated via the sensor area 50. The first line portions LP1 are located more closely to the first side S1 side than the sensor area 50. The second line portions LP2 are located more closely to the second side S2 side than the sensor area 50. Both the line portions LP1 and LP2 are connected to the power supply lines FL by the connection portions CP.

A plurality of relay wires RL that bypass the sensor area 50 are arranged around the sensor area 50. The relay wires RL and the first line portions LP1 are connected by first connection portions CP1. The relay wires RL and the second line portions LP2 are connected by second connection portions CP2. In the example of FIG. 6, the relay wires RL have an arc shape along the periphery of the sensor area 50.

The sensor area 50 is surrounded by the sub-pixels SP1, SP2 and SP3. Dummy sub-pixels DP that do not emit light are arranged around the sensor area 50. For example, the dummy sub-pixels DP are sub-pixels partially overlapping with the sensor area 50, of the regularly arranged sub-pixels SP1, SP2, and SP3. Thus, dummy sub-pixels DP may be arranged around the dummy sub-pixels DP partially overlapping with the sensor area 50. Both the connection portions CP1 and CP2 are arranged in the dummy sub-pixels DP.

The sizes of the sensor area 50, the second electrode E2, the relay wire RL, the sub-pixels SP1, SP2, and SP3, and the dummy sub-pixel DP shown in FIG. 6 are merely examples. In FIG. 6, the second electrodes E2 divided into the line portions LP1 and LP2 by the sensor area 50, and the relay wires RL connecting these line portions LP1 and LP2 are partially omitted.

Figure 7:
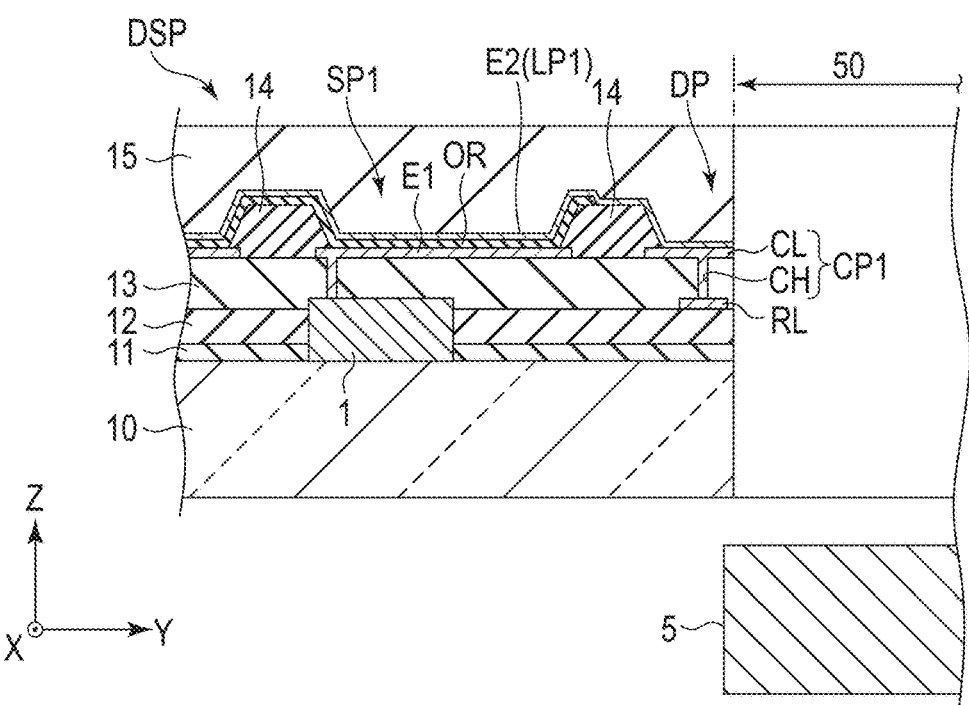
FIG. 7 is a schematic cross-sectional view showing the display device along line VII-VII in FIG. 6.

FIG. 7 is a schematic cross-sectional view showing the display device DSP along line VII-VII in FIG. 6. The pixel circuit 1 is shown in a simplified manner in this figure. The pixel circuit 1 is arranged between the substrate 10 and the insulating layer 13.

The relay wire RL is arranged between the insulating layers 12 and 13. The relay wire RL is not limited to this example, and may be arranged at the other position between the substrate 10 and the insulating layer 13, for example, between the insulating layers 11 and 12 or between the substrate 10 and the insulating layer 11. For example, the relay wire RL can be formed of the same material and by the same process as any one of the conductive layers constituting the pixel circuit 1. As an example, the relay wire RL is formed of the same material and by the same process as any one of the electrodes 31, 32, and 33 shown in FIG. 3.

The first connection portion CP1 comprises a contact hole CH penetrating the insulating layer 13 and a conductive layer CL arranged on the insulating layer 13. Both the contact hole CH and the conductive layer CL are arranged in the dummy sub-pixel DP. The conductive layer CL is in contact with a relay wire RL through the contact hole CH. For example, the conductive layer CL is formed of the same material and by the same process as the first electrode E1.

The first line portion LP1 continuously extends over the sub-pixel SP1 and the dummy sub-pixel DP. The first line portion LP1 is in contact with the conductive layer CL. As a result, the first line portion LP1 and the relay wire RL are electrically conductive with each other via the conductive layer CL.

In the example of FIG. 7, the organic layer OR is not arranged in the dummy sub-pixel DP. In addition, the pixel circuit 1 is not arranged in the dummy sub-pixel DP either. As another example, the organic layer OR may extend over the dummy sub-pixel DP, and the pixel circuit 1 may be arranged in the dummy sub-pixel DP. As described above, the sensor area 50 which is the hole is, for example, a space where none of members are arranged. As another example, the sensor area 50 may be filled with a transparent resin or the like.

A structure of the second connection portion CP2 is the same as the structure of the first connection portion CP1. In other words, the second connection portion CP2 comprises a contact hole CH penetrating the insulating layer 13 and a conductive layer CL arranged on the insulating layer 13. The second line portion LP2 and the relay wire RL are connected to each other via the conductive layer CL.

In the present embodiment described above, some of the second electrodes E2 include the first line portions LP1 and the second line portions LP2 separated via the sensor area 50, and these line portions LP1 and LP2 are connected by the relay wires RL which bypass the sensor area 50. As a result, the second electrodes E2 can be made conductive from the first side S1 to the second side S2.

Even if the line portions LP1 and LP2 are not connected by the relay wires RL, the common voltage is applied to the first line portions LP1 through the connection portions CP near the first side S1, and the common voltage is applied to the second line portions LP2 through the connection portions CP near the second side S2. However, for example, since the vicinities of the end portions of the second line portions LP2 on the sensor area 50 side are remote from the connection portions CP, the voltage drops and the display failure may occur at the sub-pixels SP near the sensor area 50. In contrast, if the line portions LP1 and LP2 are connected by the relay wires RL similarly to the present embodiment, desirable image display can be performed in the vicinity of the sensor area 50, too.

In the present embodiment, the dividing structure SSa is arranged between the adjacent second electrodes E2. In this case, even if a detour structure similar to that of the relay wires RL is to be formed in the second electrodes E2, it is difficult to realize such a detour structure due to the dividing structures SSa. If the relay wires RL are formed below the insulating layer 13 similarly to the present embodiment, the relay wires RL are not affected by the division structures SSa.

In the present embodiment, the connection portions CP1 and CP2 of the relay wires RL and the line portions LP1 and LP2 are arranged in the dummy sub-pixels DP. The influence of the connection portions CP1 and CP2 on the display quality of the sub-pixels SP1, SP2 and SP3 around the sensor area 50 can be thereby suppressed.

Second to seventh embodiments of the display device DSP will be disclosed below. The same configuration as that of the preceding embodiment can be applied for the configuration not specifically mentioned in each of the embodiments.

Second Embodiment

A shape of a relay wire RL is not limited to that disclosed in the first embodiment. Another example applicable to the relay wire RL is disclosed in the second embodiment.

Figure 8:
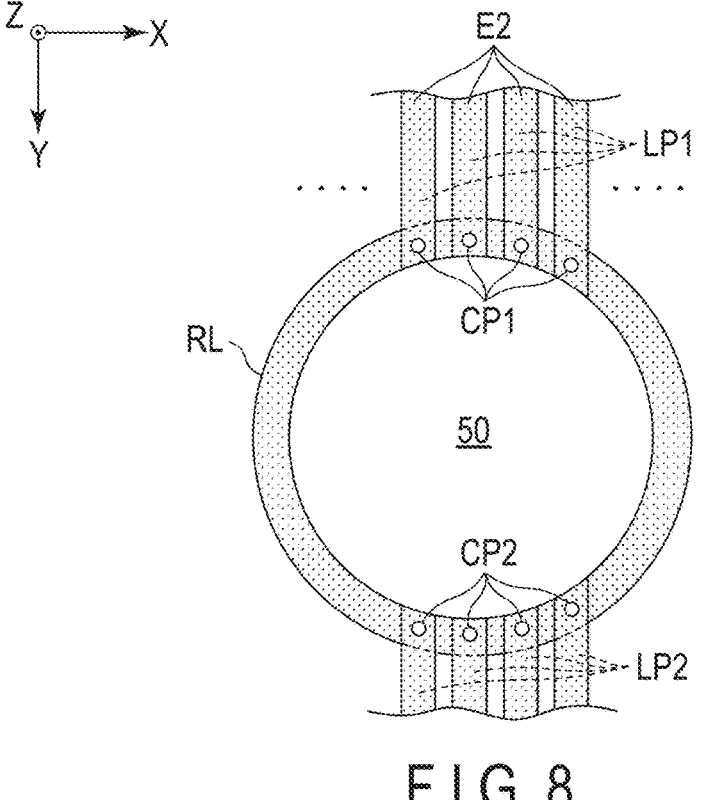
FIG. 8 is a schematic plan view showing second electrodes, a relay wire, and a sensor area according to a second embodiment.

FIG. 8 is a schematic plan view showing a second electrode E2, the relay wire RL and a sensor area 50 according to the present embodiment. The relay wire RL has a ring shape surrounding the sensor area 50. Each of first line portions L1 is connected to the relay wire RL via a first connection portion CP1. Each of second line portions L2 is connected to the relay wire RL via a second connection portion CP2.

Thus, a plurality of first line portions LP1 and a plurality of second line portions LP2 are connected by one relay wire RL in the present embodiment. In this case, a plurality of relay wires RL do not need to be arranged around a sensor area 50. Therefore, arrangement space of the relay wire RL can be made small.

Third Embodiment

A structure of a first connection portion CP1 and a second connection portion CP2 is not limited to that shown in FIG. 7. In the third embodiment, another example applicable to connection portions CP1 and CP2 is disclosed in the third embodiment.

FIG. 9 is a schematic cross-sectional view showing the first connection portion CP1 according to the present embodiment. The first connection portion CP1 includes a conductive layer CL and a contact hole CH. The conductive layer CL is arranged on an upper surface 14a of a rib 14 located between a sub-pixel SP1 and a dummy sub-pixel DP. A part of the conductive layer CL is covered with an organic layer OR. The contact hole CH penetrates an insulating layer 13 and the rib 14. The conductive layer CL is in contact with a relay wire RL through the contact hole CH.

The first connection portion CP1 further comprises a dividing structure SSb. The dividing structure SSb in the example of FIG. 9 is a partition PTb arranged on the conductive layer CL. The partition PTb includes an upper portion Ub and a lower portion Bb located below the upper portion Ub. The lower portion Bb is in contact with the conductive layer CL. A first width $W1b$ of the upper portion Ub is greater than a second width $W2b$ of the lower portion Bb ($W1b>W2b$). A width of the partition PTb gradually decreases from the upper portion Ub toward the lower portion Bb. This shape of the partition PTb may also be referred to as an inverse tapered shape.

The partition PTb divides the organic layer OR and the second electrode E2 (first line portion LP1) similarly to the above-described partition PTa. Similarly to the organic layer ORa and the conductive layer E2a shown in FIG. 5, an organic layer ORb formed of the same material as the organic layer OR and a conductive layer E2b formed of the same material as the second electrode E2 are arranged on the partition PTb.

An exposed area EA that is exposed from the organic layer OR is formed on an upper surface of the conductive layer CL, by dividing the organic layer OR by the partition PTb. The first line portion LP1 is in contact with the conductive layer CL through the exposed area EA. As a result, the first line portion LP1 and the relay wire RL are electrically conductive with each other via the conductive layer CL.

A structure of the second connection portion CP2 is the same as the structure of the first connection portion CP1. In other words, the second connection portion CP2 comprises the contact hole CH, the conductive layer CL, and the dividing structure SSb. The second line portion LP2 is in contact with the conductive layer CL through the exposed area EA formed by the dividing structure SSb.

The configuration of the connection portions CP1 and CP2 in the present embodiment can exert high tolerance to entry of moisture from the sensor area 50. In other words, in the example of FIG. 9, the organic layer OR is also arranged in the dummy sub-pixel DP, and the end portion of the organic layer OR is exposed to the sensor area 50. Even if moisture enters from this end portion, the organic layer OR of the dummy sub-pixel DP and the organic layer OR of the sub-pixel SP1 are divided by the dividing structure SSb and moisture can hardly reach the organic layer OR of the sub-pixel SP1. The degradation in display quality of the sub-pixels SP can be thereby suppressed.

The dividing structure SSb is not limited to that shown in FIG. 9. For example, the partition PTb which is an example of the dividing structure SSb may have the same overhanging shape as the partition PTa shown in FIG. 5. In addition, the dividing structure SSb may be a trench (groove) provided in the rib 14. For example, if a trench having a shape in which a width of the upper portion is smaller than a width of the lower portion is formed, the organic layer OR formed on the rib 14 by vapor deposition can be divided by the trench.

The dividing structure SSb also is not limited to that shown in FIG. 5. For example, the partition PTa that is an example of the dividing structure SSa may have the same inverse tapered shape as the partition PTb shown in FIG. 9. In addition, the dividing structure SSa may be the trench provided in the rib 14.

Fourth Embodiment

FIG. 10 is a schematic plan view showing second electrodes E2, relay wires RL and a sensor area 50 according to the fourth embodiment. It has been assumed that the sensor area 50 is a hole in the first embodiment. In the present embodiment, a substrate 10, insulating layers 11, 12, and 13, a sealing layer 15, and the like are arranged in a sensor area 50, too. The substrate 10, the insulating layers 11, 12, and 13, and the sealing layer 15 desirably have high translucency so as not to hinder the sensing of the sensor 5. For example, a rib 14 and a dividing structure SSa are not arranged in the sensor area 50.

For example, the sensor area 50 is an area which does not include at least one of the first electrode E1 and the pixel circuit 1. The sensor area 50 may also be referred to as an area which does not include the sub-pixels SP. Such a sensor area 50 has a higher transmittance than the peripheral area where the sub-pixels SP are arranged. Sensing of the sensor 5 can hardly be hindered.

In the example of FIG. 10, the first line portions LP1 and the second line portions LP2 are connected by the relay wires RL similarly to each of the above-described embodiments. The relay wires RL cross the sensor area 50. The relay wire RL connects one first line portion LP1 with one second line portion LP2.

FIG. 11 is a schematic cross-sectional view showing the display device DSP along line XI-XI in FIG. 10. The sensor area 50 includes the substrate 10, the insulating layers 11, 12, and 13, and the sealing layer 15. The relay wire RL is arranged between the insulating layers 12 and 13. The relay wire RL is not limited to this example, and may be arranged at the other position between the substrate 10 and the insulating layer 13, for example, between the insulating layers 11 and 12 or between the substrate 10 and the insulating layer 11. The first connection portion CP1 comprises a contact hole CH and a conductive layer CL similarly to the example shown in FIG. 7.

FIG. 12 is a schematic cross-sectional view showing another example of a structure that can be applied to the first connection portion CP1. This first connection portion CP1 comprises a dividing structure SSb similarly to the example shown in FIG. 9. The first line portion LP1 is in contact with the conductive layer CL through the exposed area EA formed by the dividing structure SSb. Either of the structures which are shown in FIG. 11 and FIG. 12 respectively can be applied to the second connection portion CP2, too.

FIG. 13 is a schematic plan view showing an example of a configuration that can be applied to the relay wires RL. The relay wires RL are constituted by, for example, mesh metal wires. If the relay wires RL have such a configuration, the transmittance of the sensor area 50 can be increased and the sensing of the sensor area 50 can hardly be hindered by the relay wires RL.

FIG. 14 is a schematic plan view showing yet another configuration that can be applied to the relay wire RL. In the example of this figure, the relay wire RL constituted by a mesh metal wire has a circular shape overlapping with the entire of the sensor area 50. The relay wire RL connects a plurality of first line portions LP1 with a plurality of second line portions LP2.

The relay wire RL is not limited to a mesh shape. As another example, the relay wire RL may be formed of a transparent conductive material such as ITO. In this case, the relay wire RL may have a strip shape connecting one first line portion LP1 with one second line portion LP2. In addition, the relay wire RL may have a shape which overlaps with the entire of the sensor area 50 and connects a plurality of first line portions LP1 with a plurality of second line portions LP2. Even if the relay wire RL is formed of a transparent conductive material, the transmittance of the sensor area 50 can be increased.

Fifth Embodiment

FIG. 15 is a schematic plan view showing second electrodes E2 and a sensor area 50 according to a fifth embodiment. Similarly to the fourth embodiment, not a hole, but a substrate 10, insulating layers 11, 12, and 13, a sealing layer 15, and the like are arranged in the sensor area 50.

In the present embodiment, the second electrodes E2 cross the sensor area 50, not via relay wires RL. For example, a width of the second electrode E2 is constant from an end portion of a first side S1 side toward an end portion of a second side S2 side. In another example, the width of the second electrode E2 in the sensor area 50 may be different from the width of the second electrode E2 in an area other than the sensor area 50. A shape of the portion overlapping with the sensor area 50, of the second electrode E2, may be a mesh shape as shown in FIG. 13.

To form the second electrodes E2 having a shape crossing the sensor area 50, a rib 14 and dividing structures SSa may be arranged in the sensor area 50, too. As a result, if a material of the second electrodes E2 is deposited on the entire of the display area DA including the sensor area 50, the second electrodes E2 crossing the sensor area 50 can be formed as shown in FIG. 15.

FIG. 16 is a schematic cross-sectional view showing the display device DSP along line XVI-XVI in FIG. 15. In the sensor area 50, the second electrode E2 is arranged on the insulating layer 13 and covered with the sealing layer 15. An organic layer OR is not arranged in the sensor area 50. For example, an end portion of the organic layer OR is located on the rib 14 near the sensor area 50.

FIG. 17 is a schematic cross-sectional view showing another example that can be applied to the display device DSP. In the example of this figure, the organic layer OR is arranged in the sensor area 50, too. In the sensor area 50, the sensor area 50 is located between the insulating layer 13 and the second electrode E2.

If the second electrode E2 is formed to cross the sensor area 50 similarly to the present embodiment, the relay wires RL or the connection portions CP1 and CP2 do not need to be provided. Therefore, the manufacturing process of the display device DSP can be simplified as compared with each of the above-described embodiments.

Sixth Embodiment

FIG. 18 is a schematic plan view showing second electrodes E2 and a sensor area 50 according to a sixth embodiment. Similarly to the fourth and fifth embodiments, not a hole, but a substrate 10, insulating layers 11, 12, and 13, a sealing layer 15, and the like are arranged in the sensor area 50.

In the example of FIG. 18, a conductive coating layer CV which covers the sensor area 50 is arranged. The coating layer CV has, for example, the same circular shape as the sensor area 50 and overlaps with the entire of the sensor area 50. The coating layer CV may have a shape larger than the sensor area 50. In addition, the coating layer CV may have a shape covering a part of the sensor area 50.

The coating layer CV is connected to a plurality of second electrodes E2. The coating layer CV can be formed of the same material and by the same process as the second electrodes E2. In this case, dividing structures SSa are not arranged in the sensor area 50.

A cross-sectional structure including the coating layer CV is the same as, for example, the example of FIG. 16. In other words, the coating layer CV is located between the insulating layer 13 and the sealing layer 15 in the sensor area 50. A cross-sectional structure including the coating layer CV may be the same as the example of FIG. 17. In this case, the organic layer OR is interposed between the coating layer CV and the insulating layer 13. For example, the organic layer OR has the same flat shape as the coating layer CV in the sensor area 50.

For example, when the relay wires RL cross the sensor area 50 similarly to the example of FIG. 10, when the relay wire RL has a mesh shape overlapping with the sensor area 50 similarly to the example of FIG. 14, and when the second electrodes E2 cross the sensor area 50 similarly to the example of FIG. 15, light diffraction caused by the relay wires RL and the second electrodes E2 occurs, which may affect the sensing of the sensor 5. In addition, when the sensor 5 is a camera, ghost caused by the relay wires RL and the second electrodes E2 may occur. In response to this, occurrence of diffraction and ghost can be suppressed by the configuration of arranging the coating layer CV which covers the sensor area 50.

Seventh Embodiment

It is assumed in each of the above-described embodiments that all the emitting layers EL included in the organic layers OR of the sub-pixels SP1, SP2, and SP3 emit light of the same color. In the present embodiment, it is assumed that the emitting layers EL included in the organic layers OR of the sub-pixels SP1, SP2, and SP3 emit light of different colors.

FIG. 19 is a schematic cross-sectional view showing a display device DSP according to a seventh embodiment. The structure of the boundary between the sub-pixels SP1 and SP2 is shown in this figure, but the same structure can also be applied to the boundary between the sub-pixels SP2 and SP3 and the boundary between the sub-pixels SP1 and SP3. A shape of a dividing structure SSa (partition PTa) shown in FIG. 19 is the same as that in the example of FIG. 5.

In the example of FIG. 19, an organic layer OR1 is arranged in the sub-pixel SP1, and an organic layer OR2 is arranged in the sub-pixel SP2. The organic layer OR1 comprises, for example, the light emitting layer EL which emits red light. The organic layer OR2 comprises, for example, the light emitting layer EL which emits green light. Although not shown in the cross-section of FIG. 19, the organic layer OR arranged in the sub-pixel SP3 comprises the light emitting layer EL which emits blue light.

The organic layer OR1 covers a first electrode E1 of the sub-pixel SP1 through an aperture OP, and covers a portion of a rib 14 which is closer to the sub-pixel SP1 side than a partition PTa. The organic layer OR2 covers a first electrode E1 of the sub-pixel SP2 through an aperture OP, and covers a portion of a rib 14 which is closer to the sub-pixel SP2 side than a partition PTa.

Organic layers OR1*a* and OR2*a*, and a conductive layer E2*a* covering the organic layers OR1*a* and OR2*a* are arranged on the partition PTa. The organic layer OR1*a* is formed of the same material as the organic layer OR1. The organic layer OR2*a* is formed of the same material as the organic layer OR2. The conductive layer E2*a* is formed of the same material as the second electrodes E2. The organic layer OR1*a* is separated from the organic layer OR1. The organic layer OR2*a* is separated from the organic layer OR2. In the example of FIG. 19, a part of the organic layer OR1*a* is covered with the organic layer OR2*a*.

The organic layer OR1 is formed by vacuum deposition using a mask which opens in a shape of the sub-pixel SP1. At this time, by attaching materials from a deposition source to the upper surface of the partition PTa, the organic layer OR1*a* is formed. The organic layer OR2 is formed by vacuum deposition using a mask which opens in a shape of the sub-pixel SP2, after the formation of the organic layer OR1. At this time, by attaching materials from a deposition source to the upper surface of the partition PTa, the organic layer OR2*a* is formed.

The configuration of the present embodiment can also be applied to any one of the above-described embodiments. For example, when the coating layer CV is arranged in the sensor area 50 as shown in FIG. 18, the organic layers OR1 and OR2, and the organic layer OR of the sub-pixel SP3 may be arranged to overlap under the coating layer CV.

All of the display devices that can be implemented by a person of ordinary skill in the art through arbitrary design changes to the display devices described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, additions, deletions or changes in design of the constituent elements or additions, omissions, or changes in condition of the processes arbitrarily conducted by a person of ordinary skill in the art, in the above embodiments, fall within the scope of the present invention as long as they are in keeping with the spirit of the present invention.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. A display device comprising:
   a substrate;
   a plurality of pixel circuits arranged above the substrate;
   an insulating layer covering the plurality of pixel circuits;
   a plurality of first electrodes arranged above the insulating layer and connected to the plurality of pixel circuits, respectively;
   an organic layer arranged above the plurality of first electrodes;
   a plurality of linear second electrodes arranged above the organic layer;
   a sensor area opposed to a sensor overlaid with the substrate;
   a relay wire arranged between the substrate and the insulating layer; and
   a first connection portion and a second connection portion,
   wherein
   at least one of the plurality of second electrodes includes a first line portion and a second line portion separated via the sensor area in plan view,
   the relay wire is connected to the first line portion by the first connection portion and connected to the second line portion by the second connection portion,
   the sensor area is an area which includes the substrate and the insulating layer, and does not include at least one of the first electrode and the pixel circuit, and the relay wire is constituted by a mesh metal wire crossing the sensor area.

2. The display device of claim 1, further comprising:

a plurality of dummy sub-pixels that are arranged around the sensor area and do not emit light.

3. The display device of claim 2, wherein the first connection portion and the second connection portion are arranged in the dummy sub-pixels.

4. The display device of claim 1, wherein the sensor includes at least one of a camera, a sensor for detecting ambient light, a sensor for detecting proximity of an object, and a sensor for detecting a fingerprint.

5. A display device comprising:

a substrate;

a plurality of pixel circuits arranged above the substrate;

an insulating layer covering the plurality of pixel circuits;

a plurality of first electrodes arranged above the insulating layer and connected to the plurality of pixel circuits, respectively;

an organic layer arranged above the plurality of first electrodes;

a plurality of linear second electrodes arranged above the organic layer;

a sensor area opposed to a sensor overlaid with the substrate;

a relay wire arranged between the substrate and the insulating layer; and a first connection portion and a second connection portion, wherein at least one of the plurality of second electrodes includes a first line portion and a second line portion separated via the sensor area in plan view, the relay wire is connected to the first line portion by the first connection portion and connected to the second line portion by the second connection portion, each of the first connection portion and the second connection portion comprises:

a contact hole penetrating the insulating layer; and a conductive layer which is arranged on the insulating layer and connected to the relay wire through the contact hole, the first line portion is in contact with the conductive layer of the first connection portion, the second line portion is in contact with the conductive layer of the second connection portion, the conductive layer of each of the first connection portion and the second connection portion is covered with the organic layer, each of the first connection portion and the second connection portion further comprises a dividing structure dividing the organic layer and forming an exposed area in which a part of the conductive layer is exposed from the organic layer, the first line portion is in contact with the conductive layer of the first connection portion through the exposed area formed by the dividing structure of the first connection portion, and the second line portion is in contact with the conductive layer of the second connection portion through the exposed area formed by the dividing structure of the second connection portion.

6. The display device of claim 5, wherein the dividing structure includes a partition arranged above the conductive layer, and the partition includes an upper portion having a first width, and a lower portion having a second width smaller than the first width.

7. The display device of claim 5, further comprising:

a rib arranged above the insulating layer, wherein the contact hole penetrates the insulating layer and the rib.

8. A display device comprising:

a substrate;

a plurality of pixel circuits arranged above the substrate;

an insulating layer covering the plurality of pixel circuits;

a plurality of first electrodes arranged above the insulating layer and connected to the plurality of pixel circuits, respectively;

a rib arranged above the insulating layer, an organic layer arranged above the plurality of first electrodes;

a plurality of linear second electrodes arranged above the organic layer; and a sensor area opposed to a sensor overlaid with the substrate, wherein the sensor area is an area which includes the substrate and the insulating layer, and does not include at least one of the first electrode and the pixel circuit, at least one of the plurality of second electrodes crosses the sensor area, and the organic layer is not arranged in the sensor area, and an end portion of the organic layer is located on the rib.

9. A display device comprising:

a substrate;

a plurality of pixel circuits arranged above the substrate;

an insulating layer covering the plurality of pixel circuits;

a plurality of first electrodes arranged above the insulating layer and connected to the plurality of pixel circuits, respectively;

an organic layer arranged above the plurality of first electrodes;

a plurality of linear second electrodes arranged above the organic layer;

a sensor area opposed to a sensor overlaid with the substrate; and a conductive coating layer covering the sensor area, wherein the sensor area is an area which includes the substrate and the insulating layer, and does not include at least one of the first electrode and the pixel circuit, the coating layer is connected to at least one of the plurality of second electrodes, and the coating layer covers an entirety of the sensor area.

10. The display device of claim 9, wherein the organic layer is arranged between the coating layer and the insulating layer, in the sensor area.

11. The display device of claim 9, wherein the sensor area and the coating layer have a circular shape.

* * * * *